United States Patent [19]

Ohashi et al.

[11] 4,165,499
[45] Aug. 21, 1979

[54] CHANNEL-SELECTING, PRESETTABLE, ROTARY TYPE TUNING DEVICE

[75] Inventors: Tamaki Ohashi; Susumu Sato, both of Tokyo, Japan

[73] Assignee: Nihon Technical Kabushiki Kaisha, Tokyo, Japan

[21] Appl. No.: 823,165

[22] Filed: Aug. 9, 1977

[30] Foreign Application Priority Data

Aug. 13, 1976 [JP] Japan .................................. 51-97286
Aug. 27, 1976 [JP] Japan ................................ 51-102421
Nov. 25, 1976 [JP] Japan ........................... 51-158044[U]

[51] Int. Cl.² ............................................... H03J 5/10
[52] U.S. Cl. .................................... 334/47; 74/10.45; 74/10.6; 334/57; 334/74
[58] Field of Search ....................... 334/47, 48, 50, 51, 334/55, 57, 58, 88; 325/464, 465; 74/10.15, 10.45, 10.6, 10.8

[56] References Cited

U.S. PATENT DOCUMENTS

| 3,555,914 | 1/1971 | Mase ................................. 74/10.6 |
| 3,689,853 | 9/1972 | Badger et al. ........................ 334/55 |
| 3,707,597 | 12/1972 | Lunn ................................ 334/88 X |
| 3,739,650 | 6/1973 | Mohri et al. ........................ 74/10.6 |
| 3,742,771 | 7/1973 | Kitamura ............................. 74/10.6 |
| 3,769,620 | 10/1973 | Kimura et al. ..................... 334/88 X |
| 3,783,698 | 1/1974 | Ogasawara et al. .............. 74/10.6 X |
| 3,808,896 | 5/1974 | Ogasaware et al. .................. 74/10.6 |
| 3,866,479 | 2/1975 | Miner ................................. 74/10.6 X |
| 4,043,207 | 8/1977 | Clarisse ............................. 334/51 X |

FOREIGN PATENT DOCUMENTS 50-13041 5/1975 Japan .

Primary Examiner—Paul L. Gensler
Attorney, Agent, or Firm—Lane, Aitken & Ziems

[57] ABSTRACT

A channel-selecting, presettable, rotary type tuning device in which there is provided a tuning-position-determining unit having two or more tuning-position-determining elements, whose positions may be adjustable; a slide member operably coupled to a variable tuning element and spring-loaded so as to abut the end of each tuning-position-determining element selected due to the rotation of the tuning-position-determining unit; means for rotating the tuning-position-determining unit so as to select a tuning-position-determining element; means for moving back and forth each tuning-position-determining-element thus selected; and means for temporarily releasing the slide member from its abutment on each tuning-position-determining element thus selected.

10 Claims, 26 Drawing Figures

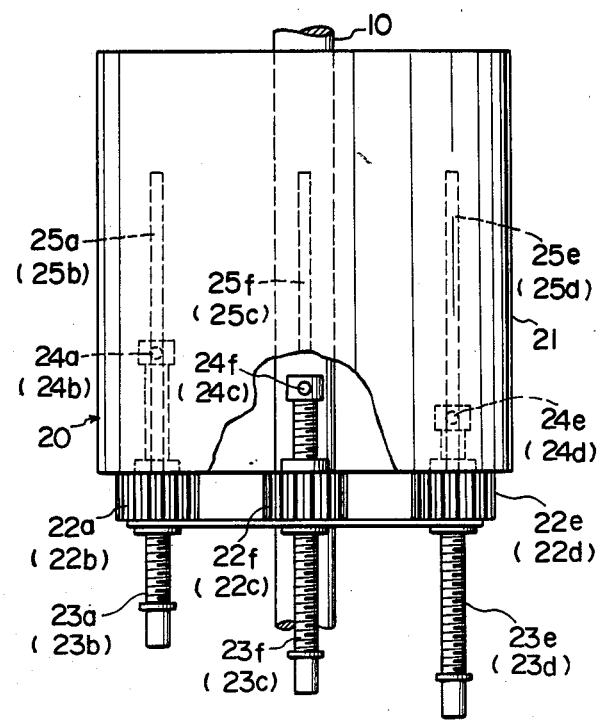
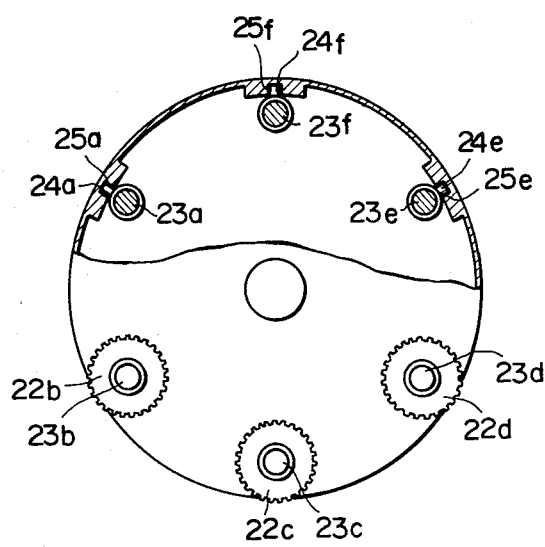

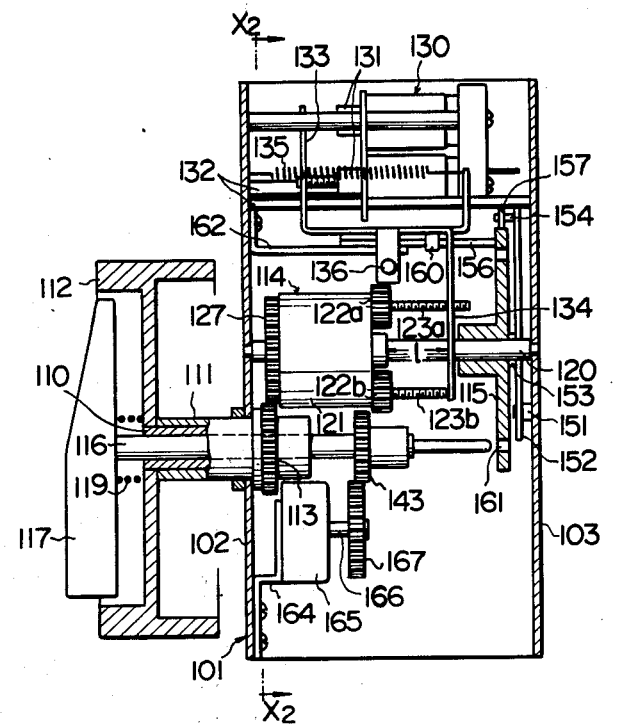
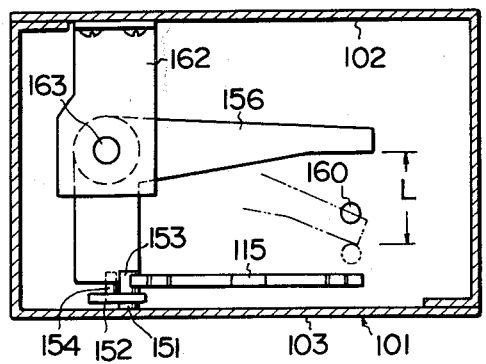

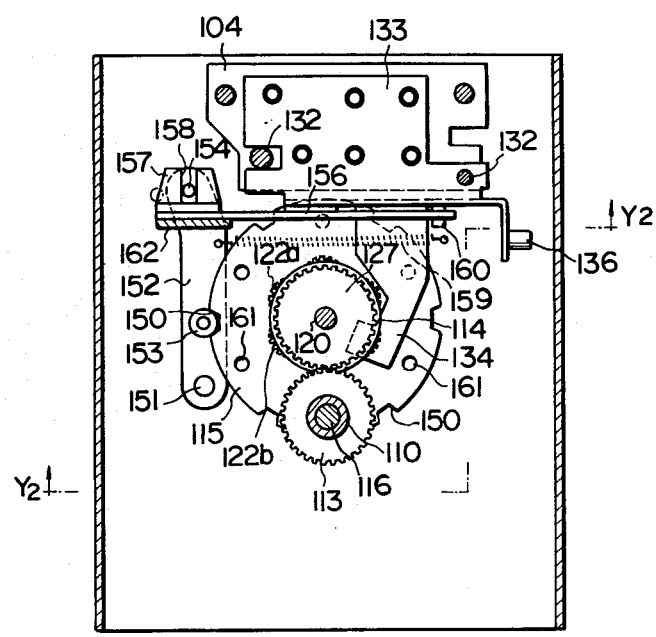

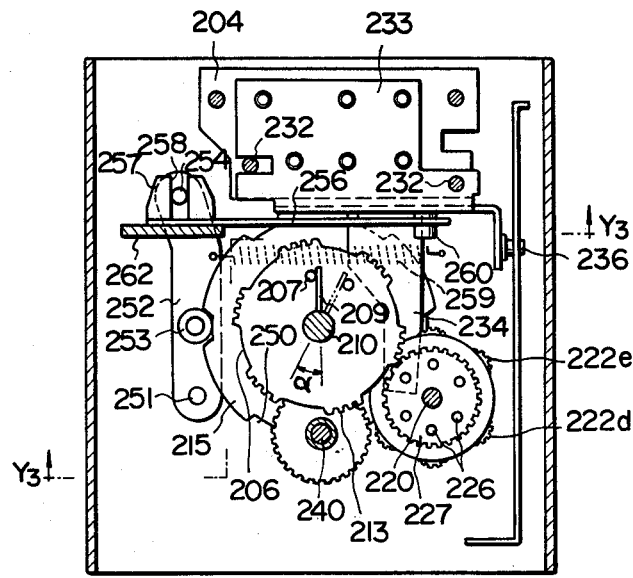
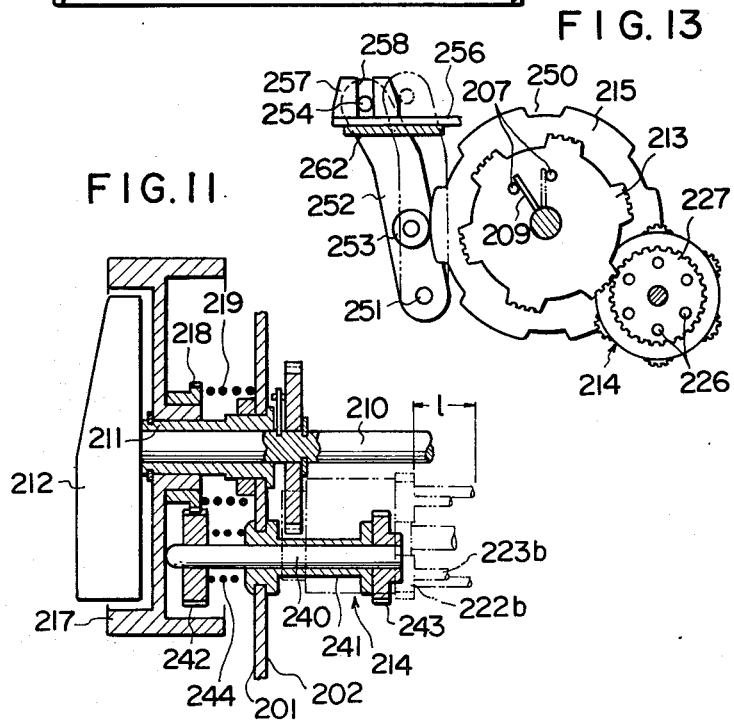

CHANNEL-SELECTING, PRESETTABLE, ROTARY TYPE TUNING DEVICE

BACKGROUND OF THE INVENTION

1. Field of the Invention

This invention relates to an improved channel-selecting, presettable, rotary type tuning device, and more particularly, to a tuning device in which there is provided a tuning-position-determining unit having two or more tuning-position-determining elements whose positions may be adjustable. The tuning device of the present invention includes a slide member operably coupled to a variable tuning element and spring-loaded so as to abut the end of each tuning-position-determining element selected according to the rotation of the tuning-position-determining unit, means for rotating the tuning-position-determining unit so as to select tuning-position-determining element, means for moving back and forth each tuning-position-determining element thus selected; and means for temporarily releasing the slide member from its abutment on each tuning-position-determining element thus selected.

2. Description of the Prior Art

Prior art channel selecting, presettable, rotary type tuning device of the type described are of such an arrangement that when a channel-selecting member is rotated, a tuning-position determining element slidingly moves along a guide surface of a slide plate so that the next tuning-position-determining element may be brought into a desired position. Accordingly, undesirable forces tend to act on the slide plate to accumulate stresses on the slide plate and its guide portion. When a channel-selecting-tuning device is installed on a vehicle such as an automobile, the aforesaid stresses are released due to the vibration of the vehicle. As a result, a slight shifting of the slide plate relative to the tuning-position-determining element occurs thus resulting in inaccurate tuning to a frequency desired. For instance, the shifting or displacement of the slide plate by 1/100 mm results in a shifting of frequency by 1 KHz. When such a shifting in frequency exceeds 3 KHz, then the tuning device can no longer be serviceable in a satisfactory manner.

In addition, when the shifting of the aforesaid tuning-position-determining element occurs repeatedly the surface of the slide plate, which contacts the tuning-position-determining element, will wear and the position of the tuning-position-determining element will so vary that the variable-tuning-element can no longer be accurately positioned in.

SUMMARY OF THE INVENTION

It is a principal object of the present invention to provide a novel channel-selecting, presettable, rotary type tuning device in which undesirable stresses are not applied to a slide plate and in which the desired tuning accuracy is insured over a long period of time.

It is another object of the present invention to provide a channel-selecting, presettable, rotary type tuning device which allows smooth tuning-position-determining and channel-selecting operations.

It is still another object of the present invention to provide a channel-selecting, presettable, rotary type tuning device which is compact in size.

These and other objects, features and advantages of the present invention will become apparent to those skilled in the art from a reading of the detailed description of the preferred embodiments to follow, taken in conjunction with the attached drawings.

BRIEF DESCRIPTION OF THE DRAWINGS

FIGS. 1 to 5 show the first embodiment of the invention, in which:

FIG. 1 is a longitudinal cross-sectional view of the tuning device according to the present invention, in which only principal components are shown;

FIG. 2 is a cross-sectional view of the principal components of the device, taken along the line X1—X1 of FIG. 1;

FIG. 3 is a cross-sectional view of a rotary plate taken along the line Y1—Y1 of FIG. 2;

FIG. 4 is a partial plan view of a tuning-position-determining unit;

FIG. 5 is a front view of the tuning-position-determining unit, alone;

FIGS. 6 to 8 show the second embodiment of the invention, in which

FIG. 6 is a longitudinal cross-sectional view of the tuning device according to the second embodiment of the invention;

FIG. 7 is a cross-sectional view of the principal components of the device, taken along the line X2—X2 of FIG. 6;

FIG. 8 is a cross-sectional view of a rotatable member, taken along the line Y2—Y2 of FIG. 7;

FIGS. 9 to 13 show the third embodiment of the tuning device according to the present invention, in which:

FIG. 9 is a longitudinal cross-sectional view of the tuning device according to the third embodiment;

FIG. 10 is a cross-sectional view of principal components of the device, taken along the line X3—X3 of FIG. 9;

FIG. 11 is a view illustrative of the engagement of a tuning-operating shaft and an intermediate transmission shaft for use in the tuning operation;

FIG. 12 is a cross-sectional view of a rotatable member, taken along the line Y3—Y3 of FIG. 10;

FIG. 13 is a view illustrative of the operation of components of the tuning device during the tuning operation;

FIGS. 14 to 19 show the fourth embodiment of the invention, in which:

FIG. 14 is a longitudinal cross-sectional view of the tuning device according to the fourth embodiment of the invention;

FIG. 15 is a cross-sectional view of principal components of the device, taken along the line X4—X4 of FIG. 14;

FIG. 16 is a view illustrative of the engagement of a tuning-operating shaft and an intermediate transmission shaft for use in the tuning operation;

FIG. 17 is a cross-sectional view of a rotatable member, taken along the line Y4—Y4 of FIG. 15;

FIG. 18 is a front view showing the engaging condition of a drive cam disc and a rocking member;

FIG. 19 is a view illustrative of the operation of a drive cam disc;

FIGS. 20 to 22 show the fifth embodiment of the invention, in which:

FIG. 20 is a longitudinal cross-sectional view of the fifth embodiment of the tuning device according to the present invention;

FIG. 21 is a pan view of principal components of the tuning device, taken along the line X5—X5 of FIG. 20;

FIG. 22 is a view of a rotatable member, taken along the line Y5—Y5 of FIG. 21;

FIGS. 23 to 26 are views showing the sixth embodiment of the tuning device according to the present invention, in which:

FIG. 23 is a longitudinal cross-sectional view of the tuning device according to the sixth embodiment of the invention;

FIG. 24 is a cross-sectional view of principal components of the tuning device, taken along the line X6—X6 of FIG. 23;

FIG. 25 is a cross-sectional view of a rotatable member, taken along the line Y6—Y6 of FIG. 24; and FIG. 26 is a perspective view of a cylindrical bearing alone.

DESCRIPTION OF THE PREFERRED EMBODIMENTS

Figure 1:
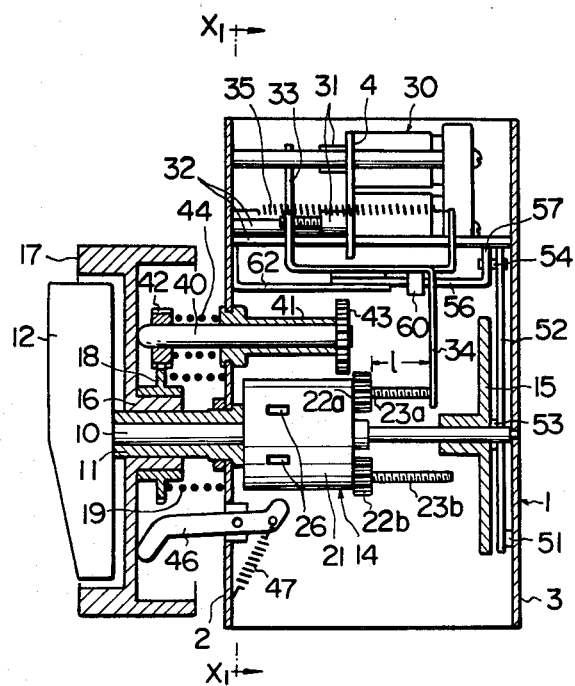
Figure 2:
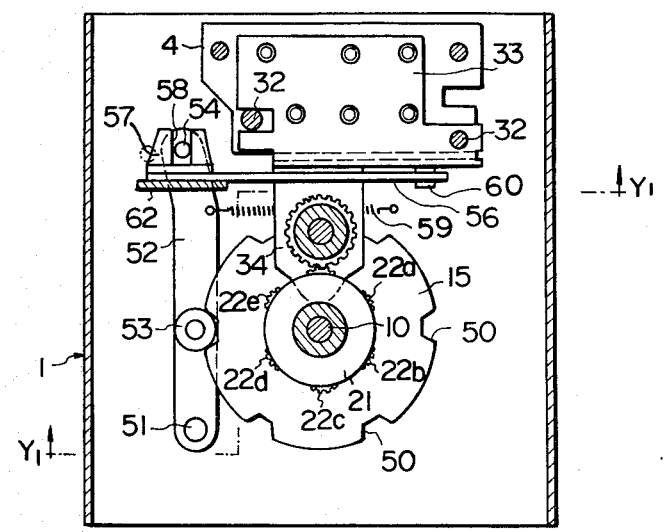
Figure 3:
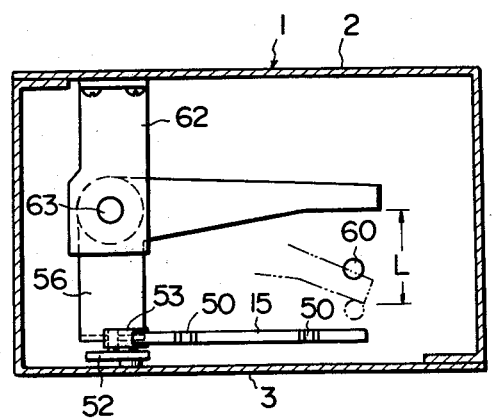
Figure 9:
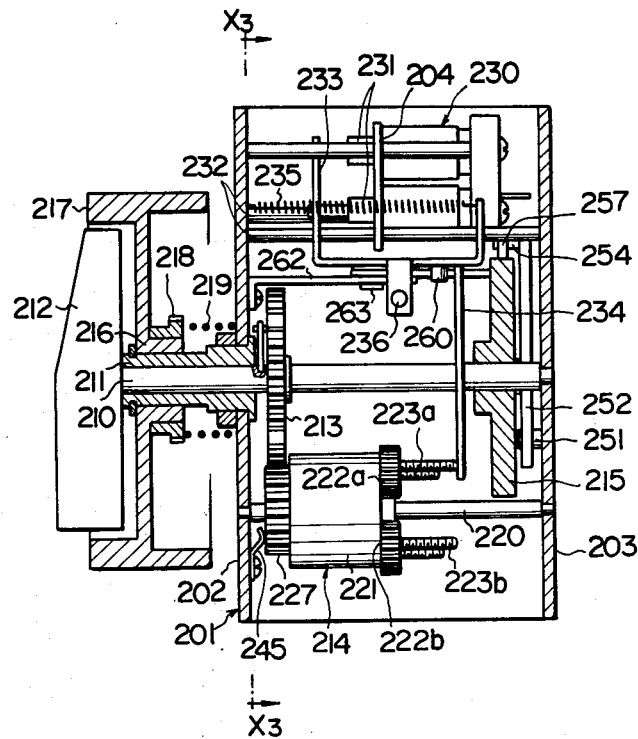

FIGS. 1 to 5 show the first embodiment of the channel-selecting, presettable, rotary type tuning device according to the present invention.

Shown at 1 is a casing of the tuning device, at 2 an upper plate or a left-hand plate, at 3 a lower plate or a right-hand plate, and at 4 an intermediate plate.

Shown at 10 is a channel-selecting shaft which is rotatable and journaled in a cylindrical bearing 11 secured to the upper plate 2. A channel-selecting knob 12 is secured to one end of the shaft 10 which protrudes from the cylindrical bearing 11 outwardly of the casing 1. The other end of the shaft 10 is journaled in the lower plate 3 opposite to the upper plate 2.

Secured on the shaft 10 between the upper plate 2 and the lower plate 3 is a tuning-position-determining-unit 14 (Hereinafter referred to as unit 14.) and a drive cam disc 15.

Shown at 16 is a tuning-operating shaft which is rotatably supported on the outer periphery of the cylindrical bearing 11 and slidable in the axial direction. A tuning knob 17 is formed on the shaft 16. Secured on the outer periphery of the shaft 16 is a gear 18. A spring 19 is confined between the gear 18 and the upper plate 2 for maintaining the tuning-operating shaft 16 in the condition shown in FIG. 1 and also returning same to the condition shown when biased to the left as viewed in FIG. 1.

The unit 14 essentially consists of a cylindrical drum type body 21 and small gears 22a, 22b . . . 22f of a number corresponding to the number of channels to be selected. The small gears are rotatably positioned on the end surface of the body 21 at equal angular spacings. Presetting threaded bars 23a, 23b . . . 23f are threaded into threaded holes provided in the centers of the small gears 22a, 22b . . . 22f, and extend in the axial direction of the drum type body 21. Projecting bars 24a, 24b . . . 24f which are integral with the ends of presetting threaded bars 23a, 23b . . . 23f are fitted in grooves 25a, 25b, . . . 25f which extend in an axial direction into the inner surface of the drum type body 21. As a result, when the small gears 22a, 22b . . . 22g are rotated, the presetting threaded bars 23a, 23b . . . 23f move back or forth in the axial direction of the drum type body 21.

Shown at 30 is a variable-tuning-inductance element secured to the intermediate plate 4 within the casing 1 by suitable fastening means. A magnetic core 31 of the element 30 is supported by a slide plate 33 adapted to be guided along a guide bar 32 extending in parallel with the shaft 10. The slide plate 33 is formed with an extending piece 34 adapted to abut each of presetting threaded bars 23a, 23b . . . 23f separately. A spring 35 is secured between the slide plate 33 and the casing 1 so that the extending piece 34 may be urged against each of the respective presetting threaded bars 23a, 23b . . . 23f. The slide plate 33 may be coupled to an indicating mechanism (not shown).

Shown at 40 is an intermediate transmission shaft which is journaled in the upper plate 2 of the casing 1, parallel with the shaft 10, and adapted to slidingly move in the axial direction. A gear 42 is secured to the end of the shaft 40 which protrudes outwardly from a cylindrical bearing 41 of the casing 1. Gear 42 meshes with the gear 18 secured to the tuning operating shaft 16. A gear 43 is secured to the other end of the shaft 40 which protrudes internally into the casing 1. Gear 43 is adapted to mesh with small gears 22a, 22b . . . 22f on the unit 14. A spring 44 is confined between the upper plate 2 and the gear 42 so that the shaft 40 is biased to the left. One end of the shaft 40 will then abut the knob 17 in a manner so as to be disengaged from one of small gears 22a, 22b . . . 22f. Accordingly, when the tuning knob 17 is biased against the action of the springs 19 and 44, the tuning operating shaft 16 and intermediate transmission shaft 40 will advance. As a result, the gear 43 will mesh with the one of small gears 22a, 22b . . . 22f, positioned to engage the gear 43. When the knob 17 is then rotated, one of the small gears will be rotated as the intermediate transmission shaft 40 rotates. The presetting threaded bar which is threaded into the small gear will therefore move in an axial direction.

Shown at 46 is a locking bar having one end which is moved into one of recesses 26 provided in a peripheral surface of the drum type body 21 of the unit 14 when the knob 17 is pressed. When the knob 17 is then rotated, the unit 14 will be prevented from also rotating. The locking bar 46 is maintained in the condition shown by means of a spring 47.

Cut-away portions 50 equal in number to that of the small gears 22a, 22b . . . 22f, are provided on the outer periphery of the drive cam disc 15 which is secured to the channel-selecting operating shaft 10. A roller 53 is rotatably supported on the intermediate portion of a rocking member 52. The latter is rotatably supported by a pivot 51. The roller 53 is adapted to fit in one of the aforesaid cut-away portions 50. A pin 54, formed on the other end of the rocking member 52, fits into a slot 58 formed in an upright piece 57. The latter is integral with one end of the 'L'-shaped rotatable member 56 which is pivotally attached at 63 to a supporting frame 62. Shown at 59 is a spring adapted to bias the roller 53 into one of the cut-away portions 50 as shown. When the cam disc 15 is rotated against a force of the spring 59, the roller 53 on the rocking member 52 moves away from cut-away portion 50 and rides on the outer periphery of the cam disc 15. The rocking member 52 is thereby swung counterclockwise, causing the pin 54 to move to the position shown by the broken line. As a result, the rotatable member 56 is pivotally moved clockwise by means of the pin 54 as viewed in FIG. 3, while the other end of the rotatable member 56 is moved from a position shown by a solid line to a position shown by the broken line. During the aforesaid movement, the other end of the rotatable member 56 abuts a pin 60 formed on the slide plate 33 so as to move the plate 33 in a direction so as to be disengaged from one of presetting threaded bars 23a, 23b . . . 23f. In this respect, the displacement of the slide plate 33 should be large enough to disengage the plate 33 from the longest of threaded bars 23a, 23b ... 23f.

The operation of the first embodiment of the tuning device according to the present invention will now be described.

When the tuning operating knob 17 is pressed from the condition shown, the intermediate transmission shaft 40 advances the gear 43 meshes with one of the small gears 22a, 22b ... 22f of the unit 14. When the knob 17 is then rotated, the small gear meshing with the gear 43 is rotated by the intermediate transmission shaft 40 so that the presetting threaded bar threaded into the small gear is moved in the axial direction. The projecting length 'l' of the threaded bar will thereby be varied. The tip of the presetting threaded bar abuts the extending piece 34 of the slide plate 33. The slide plate 33 will then be moved against or under the action of the spring 35 a distance corresponding to the projecting length 'l' of the presetting threaded bar. As a result, the variable-tuning-inductance element 30 is adjusted to a suitable position to provide desired tuning to a given channel. When the knob 17 is released from its pressed condition, the intermediate transmission shaft 40 returns to a position shown wherein the aforesaid small gear will be disengaged from the gear 43.

When the channel selecting knob 12 is rotated from the above condition, the unit 14 will rotate along with the channel selecting shaft 10. As a result, the drive cam disc 15 journaled on the shaft 10 will also rotate. The roller 53 of the rocking member 52 fitted into a cut-away portion 50 of the cam disc 15 will be disengaged from the cut-away portion causing the rocking member 52 to be rotated counterclockwise. The pivotal movement of rocking member 52 rotates the rotatable member 56, coupled to the rocking member 52 through the medium of the pin 54, clockwise as viewed in FIG. 3. The other end portion of the rotatable member 56 will then be pivotally moved to a large extent. During the above pivotal movement, the other end of the rotatable member 56 abuts the pin 60 on the slide plate 33 to slidingly move the slide plate 33 so that its extending piece 34 may be released from its engagement with a presetting threaded bar. In addition, when the channel-selecting shaft 10 is rotated through a given angle due to the rotation of the knob 12, the roller 53 on the rocking plate 52 will be fitted into a next cut-away portion 50 of the drive cam disc 15 so that the rocking member 52 and rotatable member 56 may be returned to the condition as shown. Simultaneously therewith, the slide plate 33 is also slidingly returned to its initial position by the action of the spring 35, and will then abut the next presetting threaded bar of the unit 14, thereby determining the position of the variable-tuning-inductance element 30.

When the tuning knob 17 is pressed and rotated from the above condition again, the small gear meshing with the gear 43 will be rotated so as to change a projecting length of a presetting threaded bar threaded in the small gear so that a desired channel may be selected.

In this manner, the tuning knob 17 and channel-selecting knob 12 are operated alternately so that the projecting lengths of the presetting threaded bars 23a, 23b ... 23f of unit 14 may be adjusted to desired lengths. The unit 14 may, therefore, store positions for two or more channels.

Thereafter, by rotating the channel selecting knob 12 so as to rotate the unit 14 through a given angle, a desired channel may be selected.

In short, according to the first embodiment of the channel selecting, presettable, rotary type tuning device, two or more presetting threaded bars in the tuning-position-determining unit are set to given projecting lengths corresponding to given channels by means of the tuning operating shaft. A desired channel may then be selected by a single selecting and operating shaft positioned in coaxial relation to the tuning operating shaft. The size of the tuning device may therefore be reduced. In addition, a channel may be selected by rotating the channel-selecting shaft so that the channel-selecting operation may be accomplished simply, positively and, accurately.

FIGS. 6 to 8 show a second embodiment of the channel, selecting, presettable, rotary type tuning device.

Shown at 101 is a casing, at 102 an upper plate, at 103 a lower plate, and at 104 an intermediate plate.

Shown at 110 is a channel selecting shaft of a cylindrical shape which is journaled in a cylindrical bearing 111 secured to the upper plate 102. A channel selecting knob 112 of an 'I' shaped cross section is secured to one end of shaft 110, while a gear 113 is secured to the other end of the shaft 110 the latter protrudes internally into the casing 101. Shown at 116 is a tuning operating shaft of a bar type which is coaxial with the channel selecting shaft 110 and rotatable within the shaft 110 but in axially slidable relation. A tuning knob 117 is secured to one end of the shaft 116, while a gear 143, to be described later, is secured to the other end of the shaft 116 which protrudes inwardly into the casing 101. A spring 119 is confined between the shafts 110 and 116 for returning the tuning-operating shaft 116 to the condition shown.

Shown at 120 is a rotatable shaft which is rotatably supported between the upper plate 102 and the lower plate 103 of the casing 101 and in parallel with the operating shafts 110 and 116. A tuning-position-determining unit 114 (Hereinafter referred to simply as unit 114,) is secured to the rotatable shaft 120. The unit 114 consists essentially of a cylindrical drum type body 121 having a gear 127 meshing with a gear 113 on the channel selecting shaft 110 integrally formed on the outer periphery of the drum type body 121. Small gears 122a, 122b ... 122f of a number equal to the numbers of channels to be selected are rotatably provided on the end surface of the body 121 at equal angular spacings therearound. Presetting threaded bars 123a, 123b ... 123f are threaded into threaded holes of small gears 122a, 122b ... 122f and extend in an axial direction into the drum type body 121. The respective threaded bars 123a, 123b ... 123f are moved in the axial direction when small gears 122a, 122b ... 122f are rotated due to the rotation of the gear 143 which is adapted to separately mesh wIth each of the small gears 122a, 122b, ... 122f, when the tuning-operating shaft 116 is pressed inwardly.

Shown at 130 is a variable-tuning-inductance element secured to the intermediate plate 104 within the casing 101 by suitable fastening means. A magnetic core 131 in the element 130 is supported by a slide plate 133 which is slidably guided by means of a guide bar 132 in parallel with the shaft 120 and the like. The slide plate 133 is formed with an extending piece 134 adapted to separately and selectively abut the tip of each of the threaded bars 123a, 123b ... 123f, respectively. A spring 135 is secured to the slide plate 133 and to the casing 101 so that the extending piece 134 may be brought into abutment with a presetting threaded bar. In addition, the slide plate 133 is formed with a projecting shaft 136 linked to an indicating mechanism, (not shown).

Shown at 115 is a drive cam disc secured to the rotatable shaft 120. The drive cam disc 115 is formed with cut-away portions 150 of the same number as that of the small gears 122a, 122b . . . 122f along the outer periphery of the cam disc 115. A roller 153, provided on an intermediate portion of the rocking member 152 pivotally supported by a pivot 151, is adapted to be fitted into one of the cut-away portions 150. A pin 154 is formed on the other end of the rocking member 152 and fitted into a slot 158 formed in an upright piece 157 at one end of the 'L' shaped rotatable member 156. The latter is rotatably supported by a supporting frame 162 by the medium of a shaft 163. Shown at 159 is a spring adapted to maintain the roller 153 fitted into the cut-away portion 150. When the cam disc 115 is rotated against the action of the spring 159, the roller 153 on the rocking member 152 moves off the cut-away portion 150 rides on the outer periphery of cam disc 115. The rocking member 152 is thereby pivotally moved counterclockwise, as viewed in FIG. 7. the pin 154 is thereby moved to a position shown by the broken line.

As a result, the rotatable member 156 coupled at its one end to the rocking member 152 through the medium of the pin 154 will be is rotated clockwise as viewed in FIG. 8, while the other end of the rotatable member 156 abuts the pin 160 provided on the slide plate 133. The latter plate 133 will be driven in a direction to release it from the engagement with the presetting threaded bar. In this respect, displacement of the slide plate 133 should be large enough to release the slide plate from the engagement with the longest of the presetting threaded bars.

Provided in the cam disc 115 are two or more holes 161 into which the tip of the tuning operating shaft 116 is fitted. When the shaft 116 is pushed, the rotation of the unit 144, when the small gears 122a, 122b . . . 122f are rotated, will be prevented.

Shown at 165 is an electrically variable element such as a variable resistor attached to an attaching member 164 secured to the upper plate 102 of the casing 101. A gear 167 secured to a shaft 166 meshes with a gear 143 when the shaft 116 is returned to the condition shown by means of a return spring 119.

The operation of this second embodiment will now be described.

When the tuning-operating knob 117 is pressed from a condition shown, the operating shaft 116 advances and the gear 143 meshes with one of small gears 122a, 122b . . . 122f of the unit 114. Under the above condition, when the knob 117 is rotated, the small gear will be rotated the presetting threaded bar threaded into the small gear is then moved in the axial direction so that the projecting length of the bar is varied. The extending piece 134 of the slide plate 133 abuts the tip of the presenting threaded bar the so that the slide plate 133 is moved against or under the action of the spring 135 a distance corresponding to a projecting length l of the presetting threaded bar. The variable tuning-inductance element 130 may thereby be adjusted for its position and tuning to a certain channel may be achieved. When the knob 117 is released, the operating shaft 116 is returned to a condition shown wherein the gear 143 is disengaged from the small gear, and is brought into meshing relation to the gear 167.

When the channel selecting knob 112 is then rotated under this condition, the channel selecting shaft 110 will rotate the unit 114 through the medium of gears 113 and 127. The drive cam disc 115 secured to the rotatable shaft 120 will then rotate. The roller 153 on the rocking member 152, which has been fitted into the cut-away portion 150 of the cam disc 115, will then move off the cut-away portion 150 and the rocking member 152 will be pivotally moved counter-clockwise as viewed in FIG. 7. Due to the aforesaid pivotal movement, the rotatable member 156 coupled to the rocking member 152 through the medium of the pin 154 will be rotated. The other end of the rotatable member 156 will thereby be displaced to a large extent. During this movement, the other end portion of the rotatable member 156 abuts the pin 160 on the slide plate 133 so as to slidingly move the plate 133, thereby releasing the extending piece 134 of the slide plate 133 from its abutment on a presetting threaded bar. When the knob 112 is further rotated, the channel selecting shaft 110 will be rotated through a given angle. The unit 114 and drive cam disc 115 will rotate as well through a given angle. The roller 153 on the rocking member 152 will then be fitted into the next cut-away portion 150 and the rocking member and rotatable member 156 will return to the positions shown. Simultaneously therewith, the slide plate 133 is slidingly returned under the action of the spring 135. The plate 133 will then abut the next presetting threaded bar of the unit 114, thereby determining the position of the variable tuning inductance element 130.

When the tuning operating knob 117 is pressed again from the above condition and rotated, the small gear meshing with the gear 143 will be rotated. The projecting length of a presetting threaded bar may be thus varied. As a result, another channel may be selected. In this manner, the tuning operating knob 117 and channel selecting knob 112 are alternatively operated so as to adjust projecting lengths of the presetting threaded bars 123a, 123b . . . 123f of the unit 114. As a result the unit 114 may store the positions of two or more channels. Thereafter, a desired channel may be selected by rotating the channel selecting knob 112, so as to rotate the unit 114 through a given angle. On the other hand, when the knob 117 is rotated, the electrically variable element 165 is operated through the medium of meshing gears 143 and 167 so as to adjust the volume and tone.

In short, according to the second embodiment of the channel-selecting, presettable, rotary type tuning device of the present invention, two or more presetting threaded bars in the tuning-position-determining unit may be adjusted so as to store the positions of the desired channels. As a result, one of the channels may be selected due to the operation of a single channel selecting shaft which is coaxial with the tuning operating shaft so that the tuning device itself may be small in size. In addition, the small gears 122a, 122b . . . 122f are kept away when the tuning operation is not carried out while the volume and tone is adjusted by the electric part, thereby providing a reasonable operation for the tuning operating knob. Since channel selection is made by rotating the channel operating shaft, the channel selecting operation may be carried out simply, positively and accurately.

FIGS. 9 to 13 show the third embodiment of the channel-selecting, presettable, rotary type tuning device according to the present invention.

Shown at 210 is a channel selecting shaft journaled in a hollow cylindrical bearing 211 which is secured to an upper plate 202 of casing 201 and supported by lower plate 203. A channel selecting knob 212 is secured to the end of a shaft 210 which protrudes from the cylindrical bearing 211 outwards of the casing 201. A disc or gear 213 having cut-away portions 206, equally angularly spaced (here, twelve cut-away portions) is loosely fitted on the shaft 210 in its middle portion. A pin 209, secured to the shaft 210, abuts either one of the projecting portions 207 formed on the side surface of gear 213. The projections 207 have the same central angle as that of a cut-away portion so that the channel selecting shaft 210 and gear 213 may be jointly rotated.

Shown at 216 is a hollow tuning shaft coaxial with channel selecting shaft 210 which is fitted on the outer periphery of the cylindrical bearing 211 and is rotatably slidable in the axial direction. Secured to one end of the tuning shaft 216 is a tuning knob having an 'I' shaped cross section extends in the radial direction. A gear 218, to be described later, is fitted on the outer periphery of a hub portion of the knob 217. Provided between the gear 218 and upper plate 202 is a return spring 219 for returning and maintaining the turning shaft 216 in the condition as shown.

Shown at 220 is a rotatable shaft which is rotatably supported between the upper plate 202 and the lower plate 203 of the casing 201 in parallel with the shafts 210, 216. A tuning-position-determining unit 214 (hereinafter referred to as a unit 214) is secured to the shaft 220. The unit 214 consists essentially of a cylindrical drum type body 221, and has a gear 227 secured integrally at one end of the outer periphery of unit 214. The gear 227 meshes with a gear 213 on the channel selecting shaft 210. The diameter ratio of the gear 213 to the gear 227 is about 2:1. Small gears 222a, 222b... 222f of a number corresponding to the number of channels are rotatably provided on the side of the unit 214, opposite to the side of gear 227 at an equal angular spacing. Presetting threaded bars 223a, 223b . . . 223f are threaded into threaded holes in the small gears 222a, 222b . . . 222f and extend in the axial direction. The threaded bars 223a, 223b . . . 223f may be moved forwards or backwards in the axial direction when the small gears 222a, 222b . . . 222f are rotated.

Shown at 230 is a variable-tuning-inductance element secured to an intermediate plate 204 of the casing 201 by suitable fastening means. A magnetic core 231 of the element 230 is supported by a slide plate 233 which is slidingly guided by a guide bar 232 parallel to the shaft 220. The slide plate 233 is formed with an extending piece 234 which is adapted to selectively abut the tip of threaded bars 222a, 222b... 222f. A spring 235, secured to the slide plate 233 and the casing 201, biases the slide plate 233 in one direction, thereby bringing the plate 233 into abutment with the tips of threaded bars, separately. A projecting shaft 236 is formed on the slide plate 233 for linking it to an indicating mechanism (not shown).

Shown at 240 is an intermediate transmission shaft which is journaled in a hollow, cylindrical bearing 241 secured to the upper plate 201 of the casing 201 and extending in parallel with the shafts 210, 216. (FIGS. 10, 11). A gear 242, meshing with a gear 218 which secured on the tuning shaft 216, is secured at one end of the shaft 240 in a manner to project from the cylindrical bearing 241 outwards of the casing 201. A gear 243 is secured at the other end of the shaft 240 which projects inwardly of the casing 201. The gear 243 is adapted to mesh with each small gears 222a, 222b . . . 222f, separately. The shaft 240 is biased in one direction to abut the knob 217 at one end under the action of a spring 244, confined between the upper plate 202 and the gear 242, so that the gear 243 may be disengaged from one of small gears 222a, 222b . . . 222f, which is positioned so as to mesh with the gear 243.

As a result, when the tuning knob 217 is pressed against the action of the springs 219, 244, the shaft 216 and transmission shaft 240 advance, so that the gear 243 meshes with one of small gears 222, 222b... 222f. When the knob 217 is rotated under the above condition, a small gear will be rotated through the medium of the transmission shaft 240 so that a presetting threaded bar, threaded into the aforesaid small gear, is moved in the axial direction.

Shown at 245 is a locking member whose tip is normally fitted in a hole 226 (FIG. 10) provided in one end surface of the unit 214. Rotation of the unit 214, will thereby be prevented when the knob 217 is rotated.

Shown at 215 is a drive cam disc secured to the channel selecting shaft 210, the outer periphery thereof being formed with cut-away portions of the same number as that of the small gears 222a, 222b . . . 222f. A roller 253 provided on an intermediate portion of a rocking member 252, pivoted by a shaft 251, is adapted to be fitted into one of the cut-away portions 250. A pin 254 is formed on the other end of the rocking member 252 in projecting relation and fitted in a slot defined in an upright piece 257 formed on one end of a 'L'-shaped rotatable member 256. The member 256 has a bent portion pivoted to a supporting frame 262. Shown at 259 is a spring adapted to maintain the roller 253 fitted into a cut-away portion 250. Accordingly, when the cam disc 215 is rotated against the action of spring 259, the roller 253 on the rocking member 252 moves off the cut-away portion 250 and rides on the outer periphery of cam disc 215. The rocking member 252 will then swing counterclockwise as shown in FIG. 13 and the pin 254 will move to a position shown by the solid line.

Figure 12:
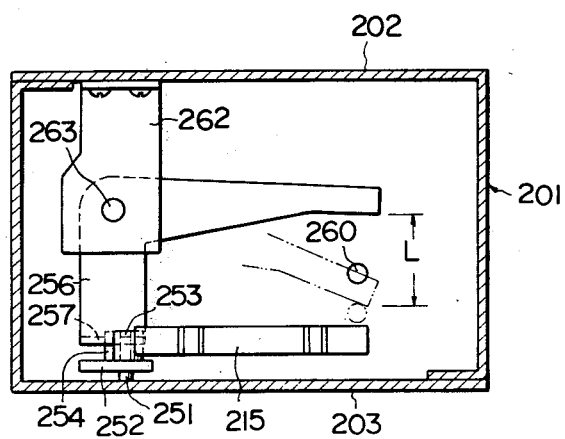

As a result, the rotatable member 256 will rotate clockwise as viewed in FIG. 12 and the other end portion of rotatable member 256 will move from the position shown by the solid line to a position shown by the broken line. During the above movement, the other end portion of rotatable member 256 abuts the pin 260 formed on the slide plate 233 so as to move the slide plate 233 in the direction releasing it from the abutment on a presetting threaded bar. In this respect, the displacement 'L' thereof should be large enough to release the slide plate 233 from the abutment with the presetting threaded bar.

The operation of the third embodiment of the tuning device according to the present invention will now be described.

When the tuning operating knob 217 is pressed from a condition shown, the intermediate transmission shaft 240 will advance so that the gear 243 will mesh with one of small gears 222a, 222b... 222f of the unit 214. Under the above condition, when the knob 217 is rotated, the small gear is rotated through the medium of the intermediate transmission shaft 240. The presetting threaded bar threaded into the small gear will then move in the axial direction so a projecting length 'l' of the presetting threaded bar may be varied. Since the tip of the presetting threaded bar abuts an extending piece 234 of a slide plate 233, the slide plate 233 will move under or against the action of the spring a distance corresponding to a projecting length 'l', so that the variable-tuning-inductance element 230 may be adjusted and tuned to a given channel. When the knob 217 is released, the intermediate transmission shaft 240 will be returned to the condition shown, and the small gear will be disengaged from the gear 243.

When the channel selecting knob 212 is then rotated under the above condition, the channel selecting shaft 210 will begin to rotate, and the drive cam disc 215 secured on the shaft 210 will rotate as well. The roller 253 on the rocking member 252 fitted in the cut-away portion 250 will move off the cut-away portion 250 so that the rocking member 252 will swing counterclockwise as viewed in FIG. 13. Due to this swinging movement, the end of the rotatable member 256 coupled to the rocking member 252 by the pin 254 will rotate causing the other end portion of member 256 to move a large extent. During the above movement, the other end portion of the member 256 abuts the pin 260 on the slide plate 233, thereby slidingly moving the slide plate 233 so that its extending piece 234 is disengaged from the presetting threaded bar. A pin 209, secured to the channel selecting shaft 210 and abutting one of two projections 207 will, thereby rotate the gear 213. The rotation of gear 213 is transmitted to the gear 227 so that the unit 214 is rotated. However, the gear 213 has a cut-away portion 206 so that the gear may not be rotated intermittently. Accordingly, during the time gear 213 is rotated through a given angle, roller 253 moves off the cut-away portion 250 of cam disc 215 so as to mesh with the gear 227 and rotate the unit 214 (FIG. 13). Unit 214 is therefore rotated through a given angle after the extending piece 234 of the slide plate 233 is released from abutment on the presetting threaded bar. After the unit 214 and drive cam disc 215 are rotated through a given angle, the roller 253 on the rocking member 252 is fitted into the next cut-away portion 250 of the drive cam disc 215. The rocking member 252 and rotatable member 256 are thereby returned to the condition shown. Simultaneously therewith, the slide plate 233 is also returned to its initial position under the action of spring 235 so that the slide plate 233 will abut against the next presetting threaded bar, thereby determining the position of the variable-tuning-inductance element 230.

When the tuning operating knob 217 is then pushed under the above condition, and rotated, the small gear meshing with the gear 243 is rotated, and the projecting length of the presetting threaded bar is varied to select still another channel.

In this manner, the tuning operating knob 217 and channel selecting knob 212 are alternately operated so that the projecting lengths of presetting threaded bars 222a, 222b... 222f may be adjusted. As a result, the unit 214 may store the positions of two or more channels.

Thereafter, by rotating the unit 214 through a given angle due to the rotation of channel-selecting knob 212, a desired channel may be selected. In addition, when the channel selecting knob 212 is rotated in the opposite direction, when same is being rotated in one direction, as shown in FIG. 10, the gear 213 will remains still until the pin 209 is moved to a position shown by the phantom line. The channel selecting shaft 210 alone will be thus rotated and the pin 209 will abut the projection 207. The unit 214 can therefore be rotated to select the next channel.

As a result, even in case the first channel obtained by reverse-rotation of the shaft 210 is selected, the unit 214 is rotated after the extending piece 234 of slide plate 233 has been released from its abutment on the presetting threaded bar so that the aforesaid series of channel selecting operations may be accomplished irrespective of a rotational direction.

In short, with the channel-selecting, presettable, rotary type tuning device according to the third embodiment, the tuning-position-determining unit is rotated after the extending piece of a slide plate has been released from its abutment on a presetting threaded bar. The extending piece 234 will not slide on the tip portion of a presetting threaded bar so smooth rotation of channel-selecting shaft 210 is achieved. In addition, the position of a presetting threaded bar will not be displaced so that the tunning point for a channel stored will not be shifted, and thus channel-selection may be accomplished in a satisfactory manner. Desired channels are stored in the form of the presetting threaded bars in the tuning-position-determining unit according to the operation of a tuning operating shaft. One of the channels thus stored may be selected according to the operation of a single channel selecting shaft disposed in parallel with the tuning operating shaft so that the size of a tuning device may be rendered compact. In addition, the channel selecting operation may be accomplished by rotating the channel selecting shaft so that the channel-selecting operation may be accomplished simply, positively and accurately.

FIGS. 14 to 19 show the fourth embodiment of the tuning device according to the present invention. A unique construction of the fourth embodiment alone will be described hereinafter in conjunction with description of the functions thereof.

Figure 14:
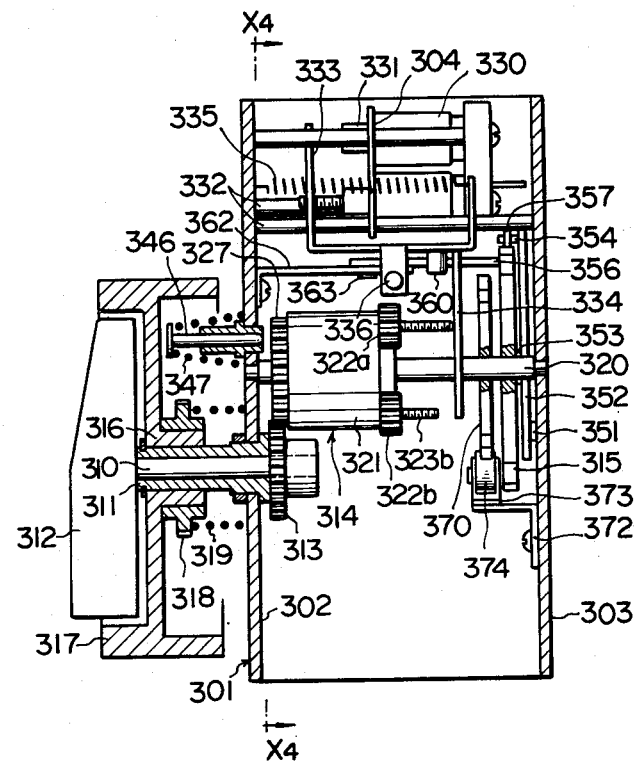
Figure 17:
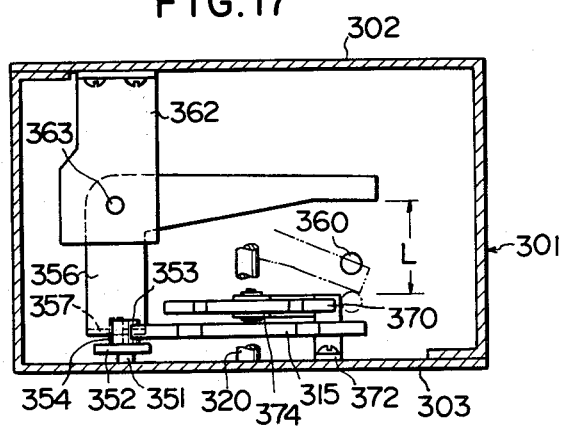
Figure 15:
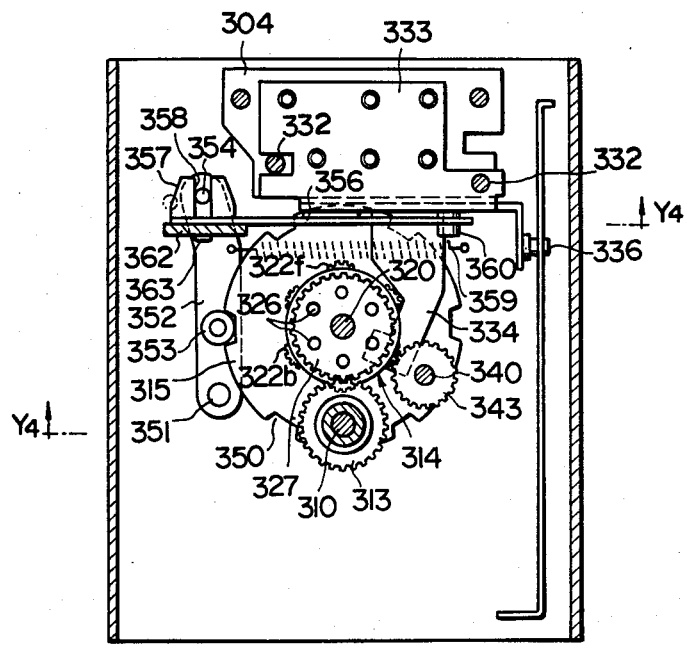
Figure 16:
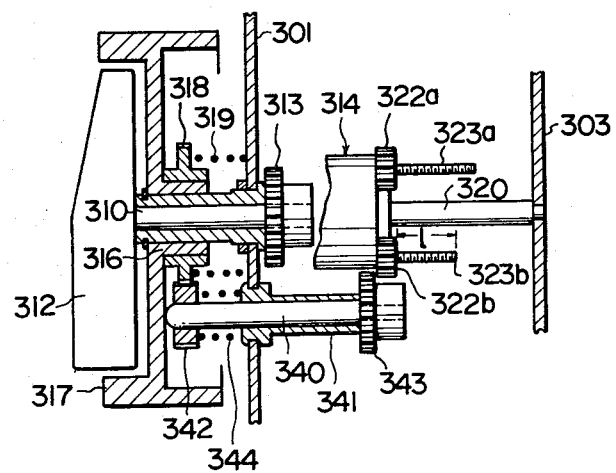

When a tuning operating knob 317 is pressed from a condition shown in FIGS. 14 and 16, an intermediate transmission shaft 340 advances and gear 343 meshes with one of small gears 322a, 322b.... 322f in a tuning-position-determining unit 314. Under the above condition, when the knob 317 is rotated, the small gear meshing therewith through the medium of the intermediate transmission shaft 340 is rotated so that a presetting threaded bar threaded into this small gear is moved in the axial direction. The projecting length 'l' of the threaded bar is thereby varied. Since an extending piece 334 of a slide plate 333 abuts against the tip of this presetting threaded bar, the slide plate 333 is moved against or under the action of spring 335 a distance corresponding to a projecting length 'l' so that the variable-tuning-inductance element 330 is adjusted and tuned to a given channel. When the knob 317 is released, the intermediate transmission shaft 340 is returned to the condition shown in FIGS. 14 to 16, and the small gear is disengaged from the gear 343.

When the channel selecting knob 312 is rotated under the above condition, the channel selecting shaft 310 is rotated, and the unit 314 begins rotating through the medium of gears 313 and 327. The drive cam disc 315 secured on the rotary shaft 320 will also begin rotating. A roller 353 on a rocking member 352 will then move off a cut-away portion 350 of the cam disc 315 so that the rocking member 352 is swung counterclockwise in FIG. 15. The movement of the rocking member 352 causes the rotatable member 356 connected to the rocking member 352 to rotate about pin 354. The other end portion of rotatable member 356 will thus move a large extent. During the above movement, the other end portion of rotatable member 356 abuts against the pin 360 on slide plate 333, thereby slidingly moving the slide plate 333 so that the extending piece 334 may be released from the abutment on the presetting threaded bar. When the channel selecting shaft 310 is rotated through a given angle due to the rotation of knob 312, the unit 314 and drive cam disc 315 will be also rotated through a given angle. The roller 353 on the rocking member 352 will then be fitted into the cut-away portion 350 of the drive cam disc 315 and the rocking member 352 and rotatable member 356 will return to the condition shown. Simultaneously therewith, the slide plate 333 is also returned to its initial position under the action of spring 335 and abuts the next presetting threaded bar of the unit 314. Thus the position of the variable tuning-inductance element 330 may be determined.

When the tuning operating knob 317 is pressed again and rotated in the aforesaid manner, a small gear meshing with the gear 343 is rotated, so that a projecting length of a presetting threaded bar will be varied. Thus still another channel may be selected.

In this manner, the tuning operating knob 317 and channel selecting knob 312 are operated alternately so that the projecting lengths of all presetting threaded bars included in the unit 314 may be adjusted, to store the positions of the channels.

Thereafter, the channel selecting knob 312 is rotated from this condition to select a desired channel.

Figure 18:
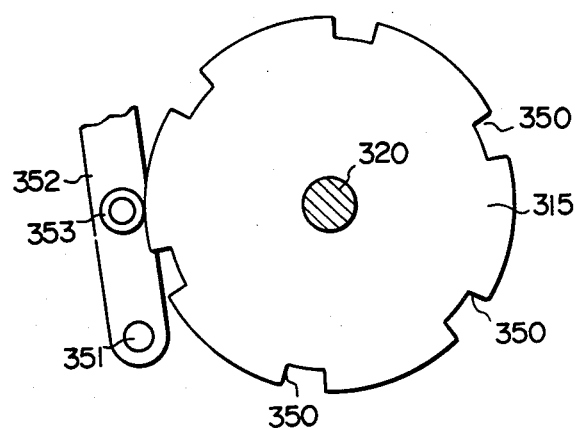
Figure 19:
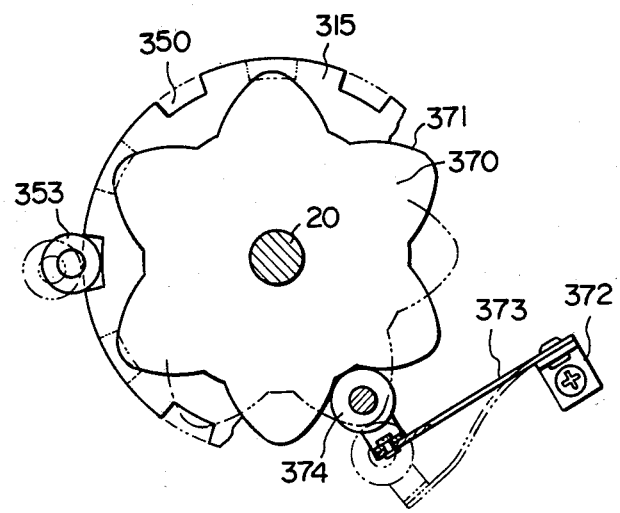

The the operation of cam disc 370 will now be described. When the channel selecting knob 312 is rotated to rotate the unit 314 through a given angle, the drive cam disc 315 coaxial with the member 314 is rotated, and the roller 353 goes in or out of the cut-away portion 350. However, when the knob 312 is stopped halfway between two channels, the roller 353 does not go into the next cut-away portion 350 as shown in FIG. 18. The slide plate 333 is then stopped to a rightwardly biased-position as shown in in FIG. 14 and a channel is not selected. In addition, the cut-away portion 350 serves to prevent the interference of the presetting threaded bars having varying lengths during the rotation of unit 314 by limiting the movement of slide plate 333 to one direction. As a result, the width of cut-away portion 350 cannot be widened large enough and the roller 353 will have difficulty in going into the cut-away portion 350. The cam disc 370 avoids the aforesaid shortcoming by allowing the roller 353 to go into the cut-away portion 350 due to the forced rotation of drive cam disc 315, even if the knob 312 is stopped halfway between two channels. A cut-away portion 371 is designed in such a manner that the roller 374 provided on the free end of a resilient plate 373 secured to a stationary member 372 at its one end necessarily drops into the cut-away portion 371, while imparting a rotational force to the cam disc 370. As a result, even if the drive cam disc 315 stops halfway as shown in FIG. 18, a rotational force is imparted to the cam disc 315 automatically, under the action of the cut-away portion 371, roller 374 and resilient plate 373 so that channels may be selected positively.

Shown at 346 is a locking rod which is slidably adapted to advance against a force of spring 347 when the knob 317 is pressed and whose tip is fitted into a hole 326 provided in one end surface of the unit 314. Rotation of unit 314 due to the rotation of knob 317 is thereby prevented.

According to the aforesaid embodiment, the cam disc 370 is provided in coaxial relation to the drive cam disc 315 (on a rotary shaft 320). However, the cam disc 370 may be provided on the channel selecting shaft 310 with the same results. Although not shown in the drawings, the cam disc 370 may be provided on a third shaft rather than shafts 310, 320, for transmitting a rotational force through gears and the like. In this case, the r.p.m. of a cam disc may be changed by changing the diameters of gears so that the number of the cut-away portions 371 should not be equal to that of cut-away portions 350.

In the fourth embodiment, two or more presetting threaded bars in a tuning-position-determining unit will store the positions of desired channels according to the operation of the tuning operating shaft so that one of desired channels may be selected. The size of a tuning device may thus be rendered compact. In addition, the channel-selecting operation of a channel-selecting shaft is accomplished by rotating the channel-selecting shaft, so that the channel selecting operation may be accomplished in a simple manner. Particularly, channels may be selected positively and accurately by means of the cam disc 370, roller 374, and resilient plate 373.

Figure 20:
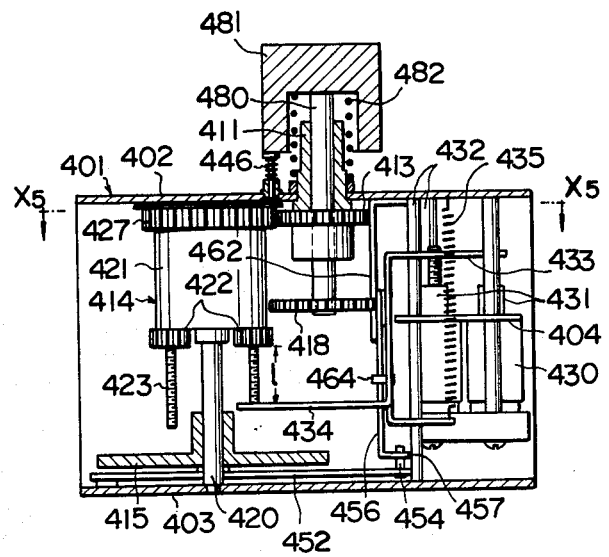
Figure 21:
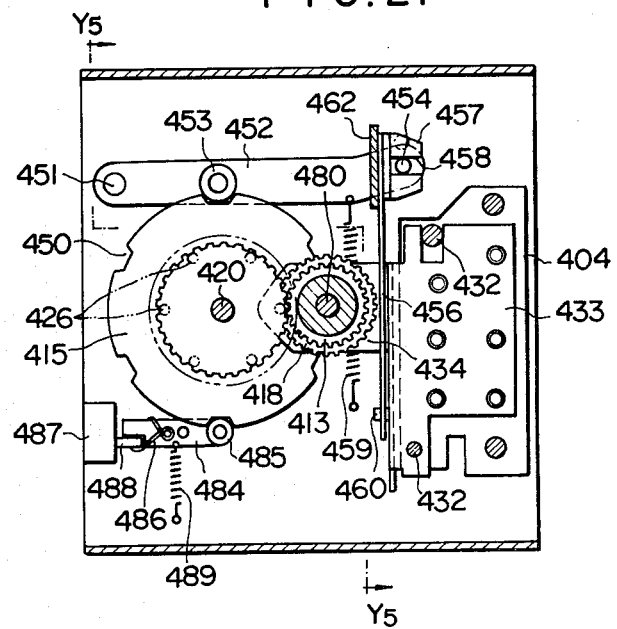

The operation of a channel selecting, presettable, rotary type tuning device according to the fifth embodiment of the invention shown in FIGS. 20 to 22 will now be described. The portions having reference numerals 402, 403, 404 and the like in a casing 401 of the tuning device correspond to those having the reference numerals 2, 3, 4 in the casing 1 in the first embodiment. For the convenience of description, those shown at 402, 403, and 404 are referred to as an upper plate, lower plate and intermediate plate, respectively.

Shown at 480 is an operating shaft serving the dual purpose of a channel selecting shaft and a tuning operating shaft in the aforesaid embodiment. The shaft 480 is journaled in a hollow, cylindrical bearing 411 secured to an upper plate 402 of casing 401 and is slidable in the axial direction. An operating knob 481 is secured to the one end of the shaft 480 which projects from the cylindrical bearing 411 outwards of the casing 401. First gear 413 and second gear 418 (to be described later) are secured on a portion of the shaft 480 which projects inwards of the casing 401. A spring 482 is confined between the knob 481 and the upper plate 402 for returning the operating shaft 480 to the condition shown.

Shown at 420 is rotary shaft which is rotatably supported between the upper plate 402 and the lower plate 403 of casing 401 and extends in parallel with the operating shaft 480. A tuning-position-determining unit 414 (Hereinafter referred to as unit 414.) is secured on the shaft 420. The unit 414 consists essentially of a drum type body 421 and has a gear 427 formed on its outer periphery at one end thereof. The gear 427 is adapted to mesh with the first gear 413 in a condition where the operating shaft 480 is returned to the position shown. Provided on an end surface of the unit 414 on a side opposite to the gear 427 are small gears 422a, 422b . . . 422f of the number corresponding to the number of channels to be selected. In this respect, each of the small gears is adapted to mesh with the second gear 418 when the operating shaft 480 is slidingly moved from the condition shown. The small gears are disposed at an equal angular spacings in a rotatable manner. In addition, presetting threaded bars 423a, 423b . . . 423f are threaded into the centers of the respective gears 422. The respective threaded bars 423 will move in the axial direction, when gears 422 are rotated. Shown at 446 is a locking shaft adapted to prevent the rotation of unit 414 when the knob 481 is rotated by forcing the tip thereof into a hole 426 provided in the end surface of the unit 414 (FIG. 21), when the knob 481 is pressed for allowing the sliding of the operating shaft 480 in the axial direction. The locking shaft 446 is journaled in a cylindrical bearing and maintained in the condition shown under the action of the spring 482.

Shown at 430 is a variable-tuning-inductance element secured to the intermediate plate 404 in the casing 401 by suitable fastening means (not shown). A magnetic core 431 of the element 430 is supported by a slide plate 433 which is slidingly guided by a guide bar 432 parallel with the shaft 420. An extending piece 434 is formed on the slide plate 433 and is adapted to abut against the tip of a threaded bar 423. A spring 435 is provided between the slide plate 433 and the casing 401 so that the slide plate 433 is biased in one direction, thereby bringing the extending piece 434 into abutment on the threaded bar 423.

Shown at 415 is a drive cam plate secured on the rotary shaft 420. Cut-away portions 450 are provided on the outer periphery of the drive cam secured on the rotary shaft 420. A roller 453, provided on an intermediate portion of a rocking member 452 and pivoted to a shaft 451 at one end, is adapted to be fitted into one of cut-away portions 450. A pin 454 is provided on the other end of the member 452 and fitted in a slot 458 formed in an upright piece 457 integral with one end of a 'L' shaped rotatable member 456 having a bent portion which is rotatably supported. Shown at 459 is a spring adapted to maintain the roller 453 in the cut-away portion 450. When the cam disc 415 is rotated against the action of spring 459, the roller 453 on the rocking member 452 moves off the cut-away portion 450 and rides on the outer periphery of cam disc 415 so that the rocking member 452 is swung counterclockwise in FIG. 21. The pin 454 is thereby moved to the position shown by the broken line.

Figure 22:
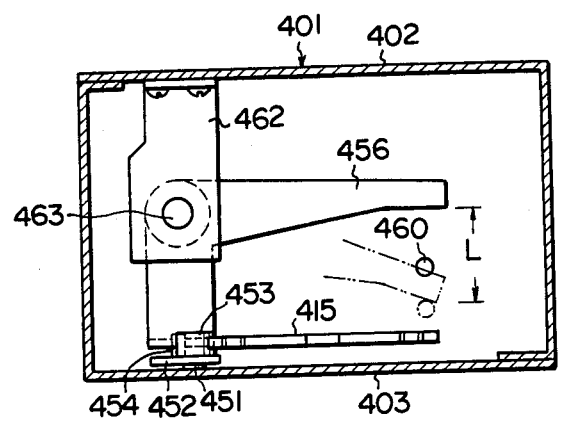
Figure 25:
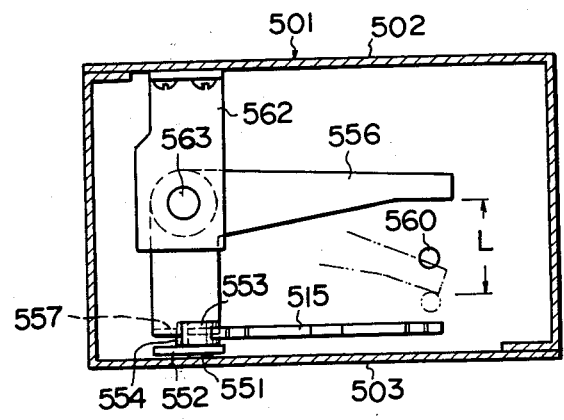
Figure 26:
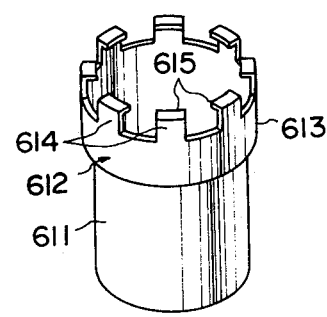

As a result, the rotatable member 456 coupled to the rocking member 452 through the medium of pin 454 is rotated clockwise in FIG. 22. The other end portion of member 456 is moved from the position shown by the solid line to the position shown by the broken line. During the above movement, the other end portion of rotatable member 456 abuts against the pin 460 formed on the slide plate 433, thereby moving the slide plate 433 in a direction to release slide plate 433 from its abutment on the presetting threaded bar 423. The displacement 'L' of the slide plate 433 should be large enough to release the abutment on the longest of the threaded bars 423.

Shown at 484 is a rotatable piece having a roller 485 at one end thereof in projecting relation therefrom and having its intermediate portion supported rotatably. Resiliently contacting the other end of the rotatable piece 484 by means of a spring wire 486 provided on the rotatable piece 484 is a movable piece 488 of a slide switch 487. In addition, the rotatable piece 484 is urged in one direction under the action of spring 489 so as to maintain the roller 485 fitted into a cut-away portion 450 of the cam disc 415. Meanwhile, the position of the rotatable member 484 is so determined that the slide switch 487 may be completely switched or thrown before the roller 485 has completely come off the cut-away portion 450, i.e., due to the slight rotation of cam disc 415. The slide switch 487 acts in a manner so the contact of switch 487 is changed due to the movement of movable piece 488, for instance, to render an electric circuit such as a low frequency amplifier inoperable.

The operation of the fifth embodiment of a tuning device according to the present invention will now be described.

When the operating knob 481 is pressed from the condition shown, the operating shaft 480 advances and the first gear 413 is disengaged from the gear 422. The second gear 418 will thus mesh with one of gears 422 of the unit 414. Under the above condition, when the knob 481 is rotated, then the gear 422 is rotated so that the threaded bar 423 moves in an axial direction and the projecting length of the bar 423 is varied. The extending piece 434 of slide plate 433 abuts the tip of the presetting threaded bar 423 so that the slide plate 433 is moved under or against the action of the spring 435 a distance corresponding to a projecting length 'l' of the threaded a bar 423. Thus the variable-tuning-inductance element 430 is adjusted and tuned to a desired channel. When the knob 481 is released, the operating shaft 480 is returned to the condition shown and the gear 418 is disengaged from the gear 422.

When the operating knob 481 is rotated from the above condition, the operating shaft 480 begins rotating, as does the unit 414. The drive cam disc 415 secured on the rotary shaft 420 will also begin to rotate. The rotatable member 484 is driven due to the slight rotation of cam disc 415, thereby throwing the slide switch 487. Thereafter, the roller 453 on the rocking member 452, which roller is fitted into the cut-away portion 450 of the cam disc 415, moves off the cut-way portion 450. As a result, the rocking member 452 is swung counterclockwise in FIG. 21. As the result of the above swinging operation, the rotatable member 456 coupled through the medium of pin 454 to the rocking member 452 is rotated so that the other end portion of the rotatable member 456 is moved to a large extent. During the above movement, the other end portion thereof abuts the pin 460 on slide plate 433, thereby slidingly moving the slide plate 433 so that its extending piece 434 is released from abutment on the threaded bar 423. When the operating shaft 480 is rotated through a given angle due to the rotation of knob 481, the unit 414 and drive cam disc 415 are also rotated through a given angle so that the roller 453 on the rocking member 452 is fitted into next the cut-away portion 450 of the drive cam disc 415. The rocking member 452 and rotatable member 456 will thus be returned to the condition shown. Simultaneously therewith, the slide plate 433 is also returned to its initial position under the action of the spring 435 and then abuts next threaded bar 423 in the unit 414, thereby determining the position of the variable tuning inductance element 430.

When the operating knob 481 is pressed and rotated again in the aforesaid manner, the gear 422 meshing with the second gear 418 is rotated so that a projecting length of the threaded bar 423 is varied for selecting still another channel.

In this manner, the operation of operating knob 481 is repeated alternately so that projecting lengths of presetting threaded bars 423 of the unit 414 may be adjusted. As a result, the unit 414 may store the position of several channels. Thereafter, the operating knob 481 is rotated to unit 414 through a given angle, as required, for selecting desired channels.

According to the fifth embodiment of the invention, therefore, the tuning-position-determining unit having two or more tuning-position-determining elements, as well as the cam disc, are rotated due to the action of the operating shaft, in addition, the slide plate cooperative with the variable tuning element is released from its abutment on the tuning-position-determining element due to rotation of the cam disc, thereby actuating a switch adapted to render an electric circuit inoperable. Thus, a low frequency amplifying circuit may be rendered inoperable by means of a switch as above, and noise produced from a speaker due to the shifting of the variable tuning element by means of the slide plate, upon the aforesaid releasing operation, may be shielded.

FIGS. 23 to 26 show the sixth embodiment of the tuning device according to the present invention with reference to its construction and operation.

In the sixth embodiment, parts different from those of the fifth embodiments are numbered in 600 order, while parts similar to each other are numbered in 500 order.

Shown at 601 is an operating shaft which serves the dual purposes of both a channel selecting shaft and a tuning operating shaft. The shaft 601 is journaled in a cylindrical bearing 511 secured to an upper plate 502 in a casing 501, as well as in a cylindrical bearing 611 secured to the lower plate 503, and is slidable in the axial direction. A first annular groove 602 and a second annular groove 603 are provided in the outer periphery of the shaft 601, and an inner end edge 615 of a bent piece 614 of a resilient member 612 secured to the cylindrical bearing 611 is adapted to be fitted in the first and second annular grooves so that the shaft 601 may be retained in rotatable manner in first and second positions.

In addition, provided in the operating shaft 601 are stoppers 604,605, on which one end of springs 631,632 abut, and stoppers 606,607 of a bar type, which are adapted to prevent the rotation of the first gear 627 and second gear 622 which are adapted to mesh with a gear 527 and a small gear 522 provided in a drum type body 521 of the tuning-position-determining-unit 514. The stoppers 606,607 are positioned between both stoppers 604 and 605.

The aforesaid resilient member 612 consists of a cylindrical root portion 613 anchored on the top end of a cylindrical bearing 611, and several projecting pieces 614 having bent inner end portions 615, which are adapted to be fitted in the first annular groove 602 and second annular groove 603.

The first gear 627 and second gear 622 have cylindrical shaft portion 629,624 formed with slits 628,623, into which the aforesaid stoppers are to be fitted. The first gear 627 is slidable by the aid of a spring 631 provided between the stopper 604 secured to the operating shaft 601, and the bar type stopper 606, with the bar type stopper 606 being fitted in the slit 628. On the other hand, the second gear 622 is slidable by the aid of spring 632 provided between the stopper 605 secured to the operating shaft 601, and the bar type stopper 607, with the bar type stopper 607 being fitted in the slit 623.

Figure 23:
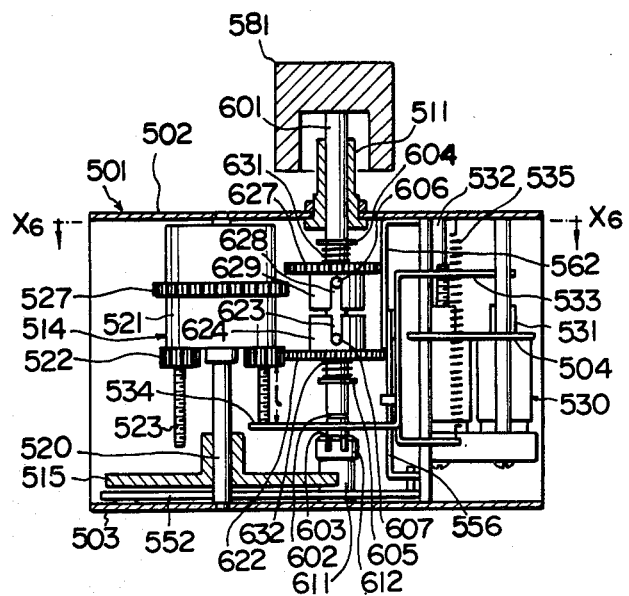
Figure 24:
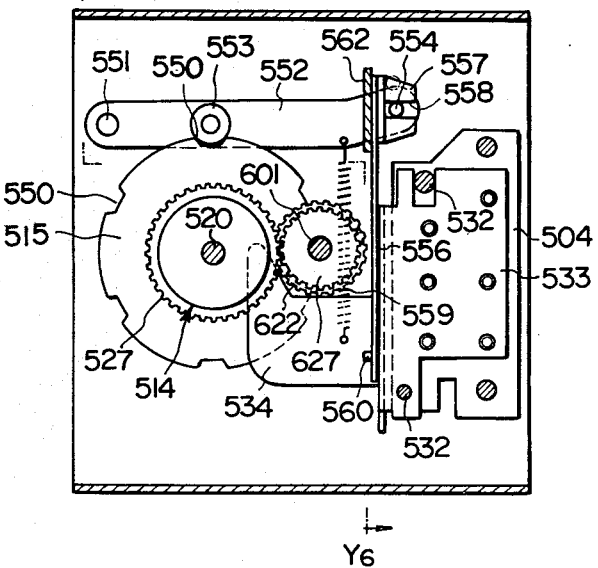

The differences in operation between the sixth and the fifth embodiment are that (i) the position of operating shaft 601 is defined by resilient member 612, and (ii) the inner bent ends 615 of projecting pieces 614 of the resilient member 612 are fitted in the second annular groove 603 in the operating shaft 601 by pulling the operating knob 581, whereupon the second gear 622 meshes with small gear 522. If a condition shown in FIG. 23 is not achieved, i.e., in case the bent inner end 615 is fitted in the second annular groove 603 but the second gear 622 fails to mesh with the small gear 522, then the knob 581 is rotated in a desired direction so that the second gear 622 may mesh with the small gear 522, automatically, under the action of the spring 632, thus avoiding the necessity of rotating the knob 581 in either direction to bring the gear 622 in meshing relation to the small gear 522. This may be applied to the case where the knob 581 is pressed so as to bring the first gear 627 into meshing relation to the gear 527 in the tuning-position-determining unit 514.

In short, the tuning device according to the sixth embodiment retains the same functions and advantages as those of the preceding embodiments, such as the ease of operation of the operating shaft, while minimizing the damage on a gear meshing with a gear secured on the operating shaft.

The invention may be embodied in other specific forms without departing from its spirit or essential characteristics. The above-described embodiments are therefore to be considered in all respects as illustrative and not restrictive, the scope of the invention being indicated by the claims rather than by the foregoing description.

What is claimed is:

1. A channel-selecting, presettable rotary type tuning device comprising:
    (a) a rotatable tuning unit having a plurality of tuning elements located at predetermined angular spacings along a circumferential end surface of said tuning unit; each said tuning element being movable in a direction parallel to the rotational axis of said tuning unit;
    (b) a channel selecting shaft parallel to the rotational axis of said tuning unit and adapted to be manually rotated in either a clockwise or counter-clockwise direction, the tuning unit being rotated in response to the rotation of the channel selecting shaft;
    (c) a slide member having one end coupled to a variable electrical tuning element and the other end adapted to selectively abut one of the tuning elements as said tuning unit is rotated in order to select a desired channel, the frequency of the selected channel being determined in accordance with the position of the tuning element abutting said slide member;
    (d) a tuning shaft having an operating knob and arranged in parallel relationship with said channel selecting shaft and adapted to be rotated when said knob is depressed, the depression of said knob causing the tuning shaft to slide axially and cause a first transmission member to operably engage a second transmission member associated with each said tuning element whereby rotation of said tuning shaft varies the position of the tuning element abutting said slide member to preset a desired channel frequency;
    (e) cam means adapted to rotate when said channel selecting shaft and said tuning unit are rotated; and
    (f) lever means cooperatively associated with said cam means and said slide member whereby the rotation of said cam means causes the lever means to displace the slide member from its abutment with a preselected tuning element and maintain said displacement until the next channel is selected whereupon said slide member returns to a position abutting the tuning element corresponding to the next selected channel.

2. A tuning device as set forth in claim 1, wherein said second transmission member associated with each tuning element is a tuning gear and each tuning element is a presetting, threaded bar which is threaded into said tuning gear, each bar being movable in the axial direction upon rotation of its respective tuning gear thereby adjusting the projection length of said bar.

3. A tuning device as set forth in claim 2, wherein said first transmission member includes a gear associated with said tuning shaft which meshes with the tuning gear associated with the threaded bar abutting said slide member when said tuning shaft knob is depressed, whereby the rotation of said tuning shaft rotates said meshing gears to move said bar in an axial direction.

4. A tuning device as set forth in claim 1, wherein said channel selecting shaft includes a gear adapted to mesh with a second gear located along a circumferential surface of said tuning unit opposite the surface from which said tuning elements project, whereby rotation of said channel selecting shaft will cause said tuning unit to rotate.

5. A tuning device as set forth in claim 1, wherein said channel selecting shaft and said tuning shaft are a single shaft, said single shaft being rotatable and axially slidable between first and second positions, in said first position said shaft operating to rotate said tuning unit and in said second position said shaft being axially slid by depression of said knob to operably engage the second transmission member associated with the tuning element abutting said slide plate to vary the projection length of said tuning element.

6. A tuning device as set forth in claim 5, wherein a first gear associated with said shaft is adapted to mesh with a gear associated with a circumferential surface of said tuning unit opposite that from which said tuning elements project to rotate said tuning unit when said shaft is in the first position, said first transmission member including a second gear associated with said shaft adapted to mesh with a gear forming each second transmission member when said shaft is in the second position.

7. A tuning device as set forth in claim 6, wherein said shaft is returned to the first position by the action of a spring.

8. A tuning device as set forth in claim 3, wherein said channel selecting shaft and said tuning shaft are associated in coaxial relation to each other.

9. A tuning device as set forth in claim 8, wherein said channel selecting shaft includes an extending portion constituting a rotary shaft for rotating said tuning unit and said cam means and wherein said tuning shaft includes a sleeve shaft slidingly and rotatably fitted on the outer periphery of said channel selecting shaft.

10. A tuning device as set forth in claim 8, wherein said channel selecting shaft includes a sleeve shaft rotatably fitted on the outer periphery of said tuning shaft.

* * * * *